United States Patent
Lin et al.

(10) Patent No.: US 9,449,959 B2
(45) Date of Patent: Sep. 20, 2016

(54) ESD PROTECTION CIRCUIT CELL

(71) Applicant: Taiwan Semiconductor Manufacturing Co., Ltd., Hsin-Chu (TW)

(72) Inventors: Wan-Yen Lin, Kaohsiung (TW); Jam-Wem Lee, Zhuebei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 232 days.

(21) Appl. No.: 13/921,226

(22) Filed: Jun. 19, 2013

(65) Prior Publication Data

US 2014/0376133 A1    Dec. 25, 2014

(51) Int. Cl.
*H02H 9/04* (2006.01)
*H01L 27/02* (2006.01)

(52) U.S. Cl.
CPC .......... *H01L 27/0259* (2013.01); *H02H 9/046* (2013.01)

(58) Field of Classification Search
CPC ........ H02H 9/04; H02H 9/041; H02H 9/046; H01L 27/0259
USPC ................................... 361/56, 119
See application file for complete search history.

(56) References Cited

U.S. PATENT DOCUMENTS

| 4,905,119 A * | 2/1990 | Webb ............................. 361/119 |
| 2013/0032882 A1* | 2/2013 | Salcedo et al. ............... 257/355 |
| 2013/0066453 A1* | 3/2013 | Seefeldt ......................... 700/94 |

OTHER PUBLICATIONS

Application Note AN3353, IEC 61000-4-2 standard testing from STMicroelectronics, Doc ID 018527 Rev 1, Jun. 2011, 9 pages.

* cited by examiner

*Primary Examiner* — Stephen W Jackson
*Assistant Examiner* — Christopher Clark
(74) *Attorney, Agent, or Firm* — Duane Morris LLP

(57) ABSTRACT

A device includes a first bidirectional PNP circuit coupled to a first output of an communication circuit, and a second bidirectional PNP circuit coupling to a second output of the communication circuit. The first and second bi-direction PNP circuits have coupled outputs and a first breakdown voltage. A third bidirectional PNP circuit is coupled to ground via the coupled outputs of the first bidirectional PNP circuit and of the second bidirectional PNP circuit. The third bidirectional PNP circuit has a second breakdown voltage. In some arrangements, a sum of the first breakdown voltage and the second breakdown voltage exceeds 60 volts. The communication circuit can be an automotive application circuit for a serial automotive communication application. The first and second bidirectional transistor circuits can form a part of a cell of an integrated circuit having an isolation structure to sustain high voltage.

18 Claims, 5 Drawing Sheets

ESD PROTECTION CIRCUIT CELL

FIELD

The disclosed circuit and method relate to integrated circuits. More particularly, the disclosed system and method relate to electrostatic discharge ("ESD") protection for integrated circuits.

BACKGROUND

With the continued miniaturization of integrated circuit ("IC") devices, the current trend is to produce integrated circuits having shallower junction depths, thinner gate oxides, lightly-doped drain ("LDD") structures, shallow trench isolation ("STI") structures, and self-aligned silicide ("salicide") processes, all of which are used in advanced sub-quarter-micron complementary metal oxide semiconductor ("CMOS") technologies. All of these processes cause the related CMOS IC products to become more susceptible to damage due to ESD events. Therefore, ESD protection circuits are built onto the chip to protect the devices and circuits on the IC from ESD damage.

Automotive communication circuits in particular, have standards that involve sustaining high voltage and passing system level ESD. On-chip ESD designs for automotive circuit usually result in large ESD clamps having large chip areas.

DETAILED DESCRIPTION

Figure 1:
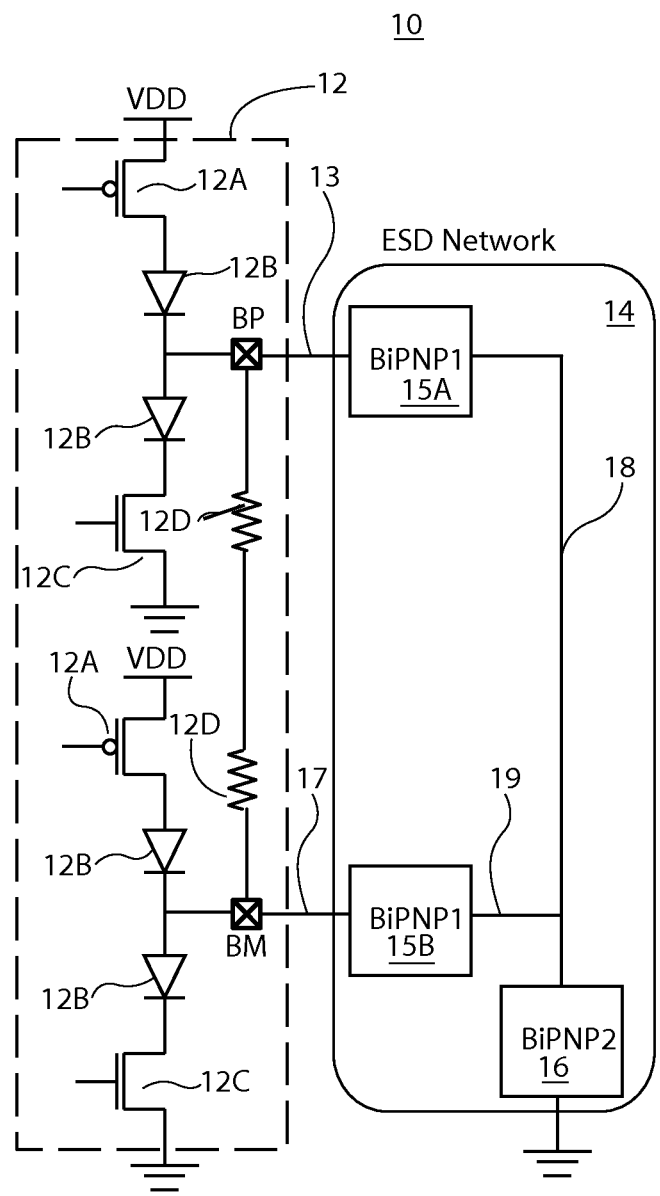
FIG. 1 is a schematic diagram of an ESD protection circuit coupled to an automotive communication circuit according to one embodiment.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In various embodiments, an ESD protection circuit is provided as a standard cell of a cell library. The ESD protection cell may be readily incorporated into IC designs.

FIG. 1 is a schematic diagram of a system 10 including a first embodiment of a protection circuit 14 for an automotive communication circuit 12. The protection circuit 14 is an ESD network having a plurality of bi-directional PNP (BiPNP) transistors 15A, 15B, and 16. The BiPNP transistors 15A and 15B are the same structurally and operate or have a first breakdown voltage BV1. The BiPNP transistor 16 can be structurally different from BiPNP transistors 15A and 15B and has a second breakdown voltage BV2, which can be different from the first breakdown voltage. One design criteria for proper operation with automotive communication circuits may entail that the summation of the breakdown voltages of BiPNP 15A or 15B plus BiPNP 16 should exceed 60 volts.

The communication circuit 12 can come in any number of forms. For example, in one embodiment, the communication circuit includes a power source VDD coupled to a PNP transistor 12A serially coupled to two diodes 12B and a NPN transistor 12C coupled to ground. In between the two diodes 12B is a positive serial output BP 13. The communication circuit 12 further includes a second parallel circuit as described above having the power source VDD coupled to a PNP transistor 12A serially coupled to two diodes 12B and a NPN transistor 12C coupled to ground. In between the two diodes 12B of the second parallel circuit is a "minus" serial output BM 17. The outputs BP 13 and PM 17 can be coupled to each other via two resistors 12D as shown. The outputs BP 13 and the PM 17 are coupled to the protection circuit 14 and more particularly the output BP 13 is coupled to the input port of BiPNP transistor 15A and the output BM 17 is coupled to the input port of BiPNP transistor 15B. An output 18 of BiPNP1 15A is coupled to an output 19 of BiPNP transistor 15B. The coupled outputs 18 and 19 couple to an input port of the BiPNP2 transistor 16. The BiPNP2 transistor 16 is coupled to ground.

Figure 2:
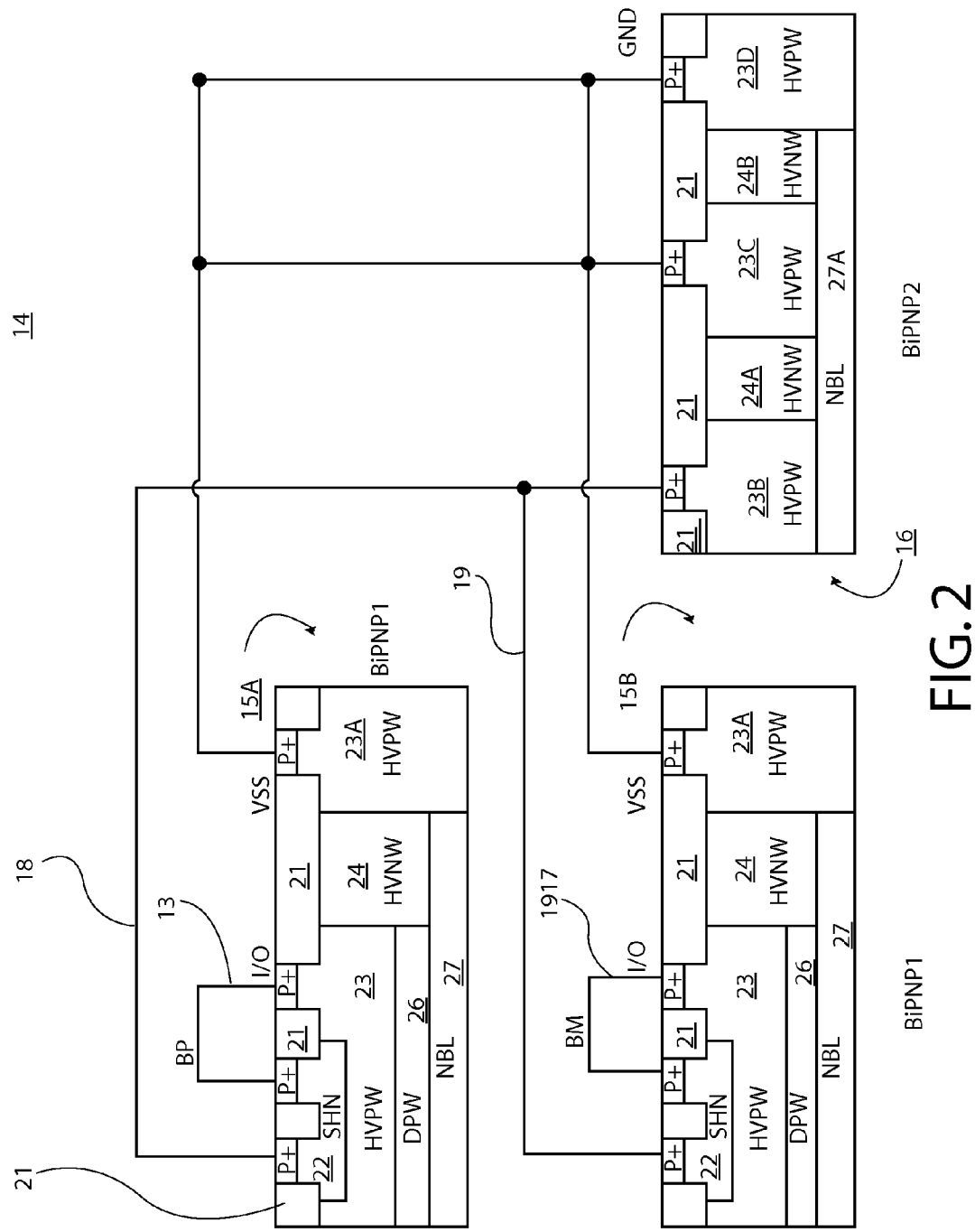
FIG. 2 is a cross-sectional view of the ESD protection circuit of FIG. 1 according to one embodiment.

FIG. 2 illustrates an equivalent cross-sectional view of the protection circuit 14 of FIG. 1. In one embodiment, the BiPNP1 15A and BiPNP1 15B are structurally the same. Each BiPNP1 15A and 15B can include a substrate having an N-type buried layer (NBL) 27. The substrate can be formed from a variety of materials including, but not limited to, bulk silicon, silicon-phosphorus (SiP), silicon-germanium (SiGe), silicon-carbide (SiC), germanium (Ge), silicon-on-insulator silicon (SOI-Si), silicon-on-insulator germanium (SOI-Ge), or combinations thereof.

Above a portion of the NBL 27 is a deep P-well (DPW) 26 and a high voltage N-type well (HVNW) 24. DPW 26 can be formed by doping the substrate with a suitable p-type dopant such as, for example, boron, gallium, aluminum, or any Group III element. HVNW can be formed by doping the substrate with a suitable n-type dopant. Examples of suitable n-type dopants include, but are not limited to, arsenic, phosphorus, antimony, or other Group V element.

Above a portion of the DPW 26 is a high voltage P-type well (HVPW) 23. Above a portion of the HVPW 23 lies a shallow N well (SHN) 22. Adjacent to the NBL 27 and HVNW 24 is another HVPW 23A. Above the various portions of the SHN 22, HVPW 23, HVNW 24 and HVPW 23A are isolation regions 21 and P+ diffusion regions that serve as input or output ports or VSS connections to ground. The isolation regions 21 can be shallow trench isolation (STI) regions. The P+ diffusion areas are separated by the isolation regions 21. The P+ diffusion regions can be formed by doping the regions with a suitable p-type dopant to a concentration that is different than the concentration to which the HVPW is doped.

The BiPNP2 16 can include a substrate having an N-type buried layer (NBL) 27A. Above a portion of the NBL 27A is a high voltage P-type well (HVPW) 23B, a high voltage N-type well (HVNW) 24A, another HVPW 23C, and another HVNW 24B. Adjacent to the NBL 27A and HVNW 24B is another HVPW 23D. Above the various portions of the HVPW 23B, HVNW 24A, HVPW 23C, HVNW 24B, and HVPW 23D are isolation regions 21 and P+ diffusion regions that serve as input or input ports or ground connections.

Figure 3:
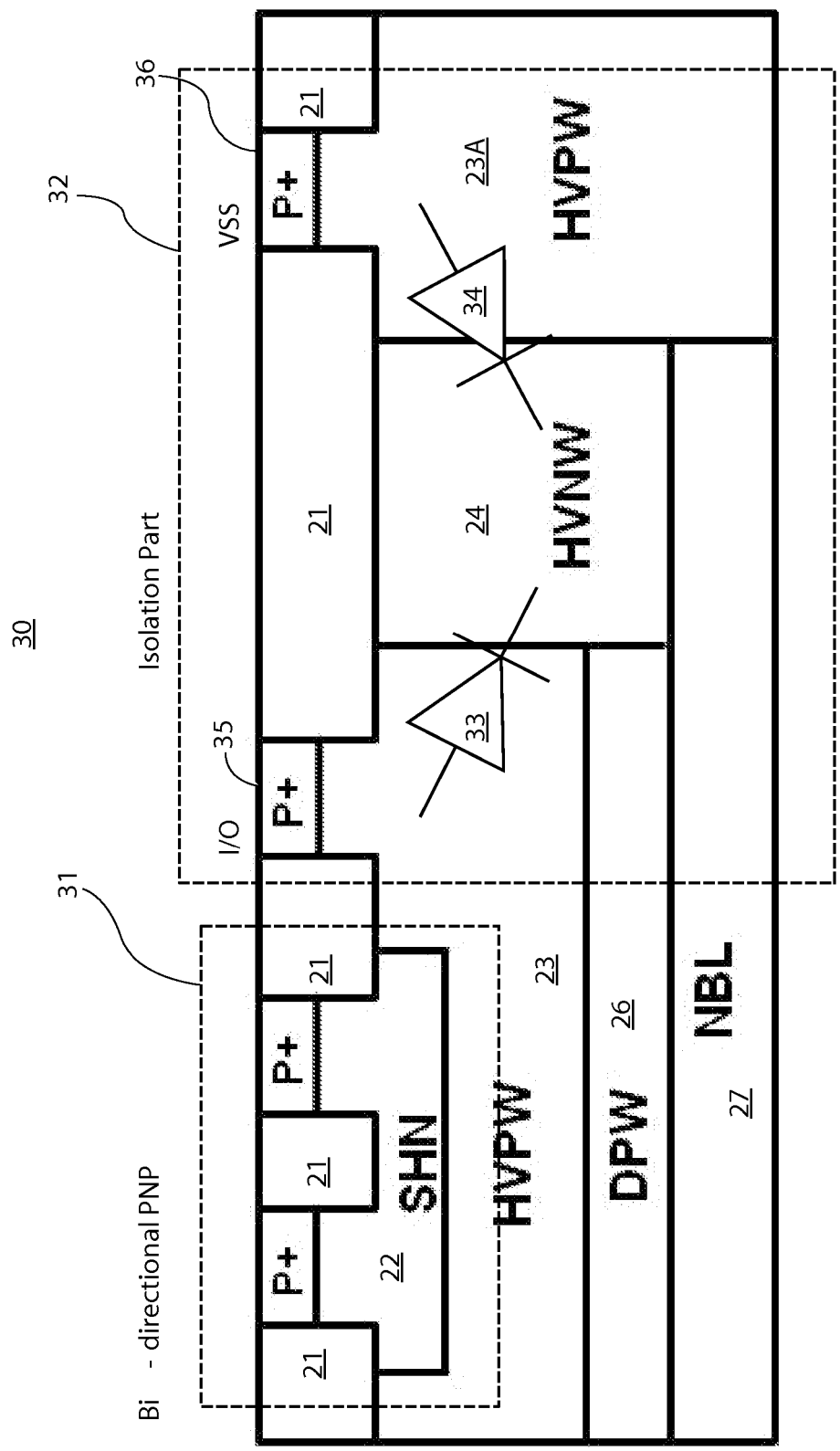
FIG. 3 is a cross-sectional view of a bi-directional PNP circuit and isolation structure of the ESD protection circuit of FIG. 1 according to one embodiment.

Referring to FIG. 3, a more detailed cross-sectional view of a BiPNP circuit 30 illustrates a Bi-directional PNP portion 31 and an isolation portion 32. The BiPNP circuit 30 has the same structure as the BiPNP circuits 15A and 15B described above. The Bi-directional PNP portion 31 includes SHN region 22, the isolation regions 21, and the P+ diffusion regions as shown. The isolation portion 32 includes HVPW 23, HVNW 24, and HVPW 23A as well as the corresponding isolation regions 21 and P+ diffusion regions as shown. Each interfacing HVPW and HVNW act as PN junction diodes. For example, HVPW 23 and HVNW 24 act as PN junction diode 33 and HVNW 24 and HVPW 23A act as PN junction diode 34. The PN junction diodes 33 and 34 provide an isolation structure able to withstand high voltage. Operationally, the potential of HVNW 24 is coupled to an I/O port 35 or VSS 36 having the relatively higher voltage. For example, if VSS 36 has a potential of −36V and the I/O port 35 has a potential of +10 volts, the HVNW 24 is coupled to the VSS 36. The structure of BiPNP 30 or BiPNP 15A and 15B enables a space or area savings for high voltage applications using clamp structures as described above. The structure of BiPNP 30 can be a part of a stack cell having its own isolation ring that can prevent un-expected leakage current. In other words, each BiPNP1 15A and 15B as well as BiPNP2 16 can have its own isolation ring.

Figure 4:
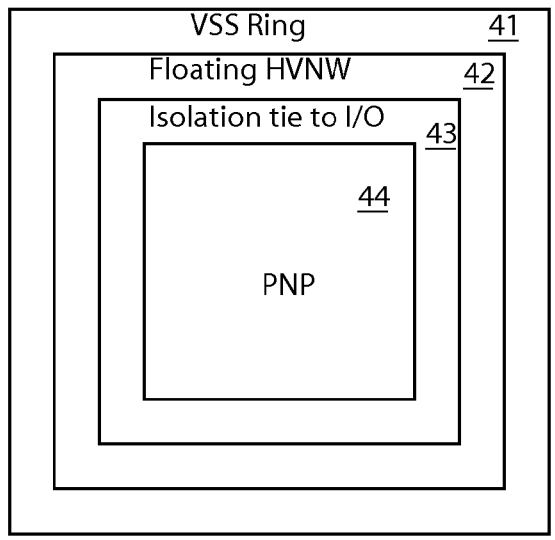
FIG. 4 is a top plan view of the layout of FIG. 3 according to one embodiment.

FIG. 4 illustrates a top layout view 40 of the circuit 30 of FIG. 3. The top layout view 40 shows a bi-directional PNP 44 corresponding to the bi-directional PNP 31 of FIG. 3. The view 40 further includes a region 43 representing an isolation tie or link to the I/O 35 of FIG. 3 and further corresponding to the PN junction diode 33. A region 42 in the view 40 corresponds to the HVNW 24 of FIG. 3 representing a "floating" HVNW. A floating HVNW means that the HVNW can tie to the I/O 35 or the VSS 36, depending on the relatively higher potential of I/O 35 or VSS 36 as explained above. The view 40 further includes a region 41 representing the tie or link to VSS 36 of FIG. 3 and corresponding to the PN junction diode 34 forming an isolation ring.

Figure 5:
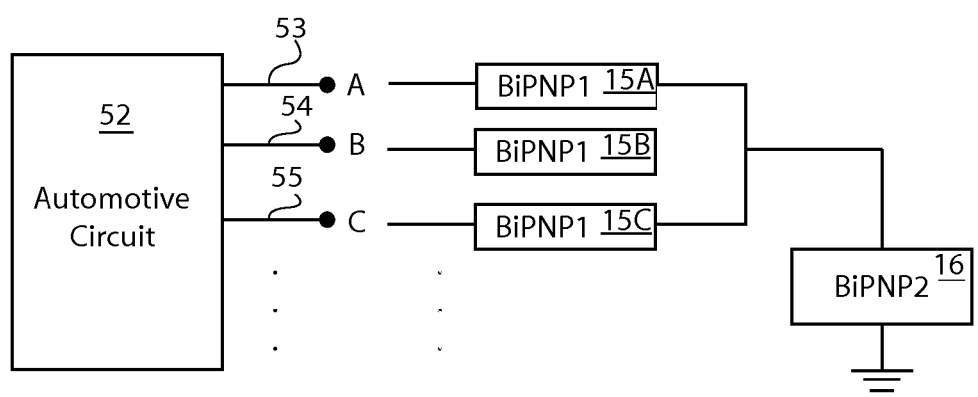
FIG. 5 is schematic diagram of an ESD protection circuit coupled to an automotive circuit according to one embodiment.

FIG. 5 represents an alternative embodiment 50 of an automotive circuit 52 having more than two ports and a stacked bi-directional clamp structure. In one embodiment, the automotive circuit 52 can include three serial communication ports 53 or "A", 54 or "B" and 55 or "C". In this example, the stacked bi-directional clamp structure includes a corresponding BiPNP1 circuit coupled to each communication port of the automotive circuit. Port 53 couples to an input port of BiPNP1 15A, port 54 couples to an input port of BiPNP1 15B, and port 55 couples to an input port of BiPNP1 15C. Each BiPNP1 (15A, 15B, and 15C) has their corresponding outputs coupled together and their coupled outputs couple to an input port of BiPNP2 16. As in the prior examples, each BiPNP1 (15A, 15B, and 15C) and BiPNP2 16 can have its own isolation ring.

In some embodiments, the bi-directional clamp structure of FIGS. 1 and 2 can be used with an automotive serial communication application known as "FlexRay" as developed by the FlexRay Consortium having BP and BM pins or ports. The bi-directional clamp structure provides ESD protection for higher voltage applications in a space efficient manner. As shown in FIG. 5, the bi-directional clamp structure can be adapted to other automotive circuits having two or more communication ports.

Figure 6:
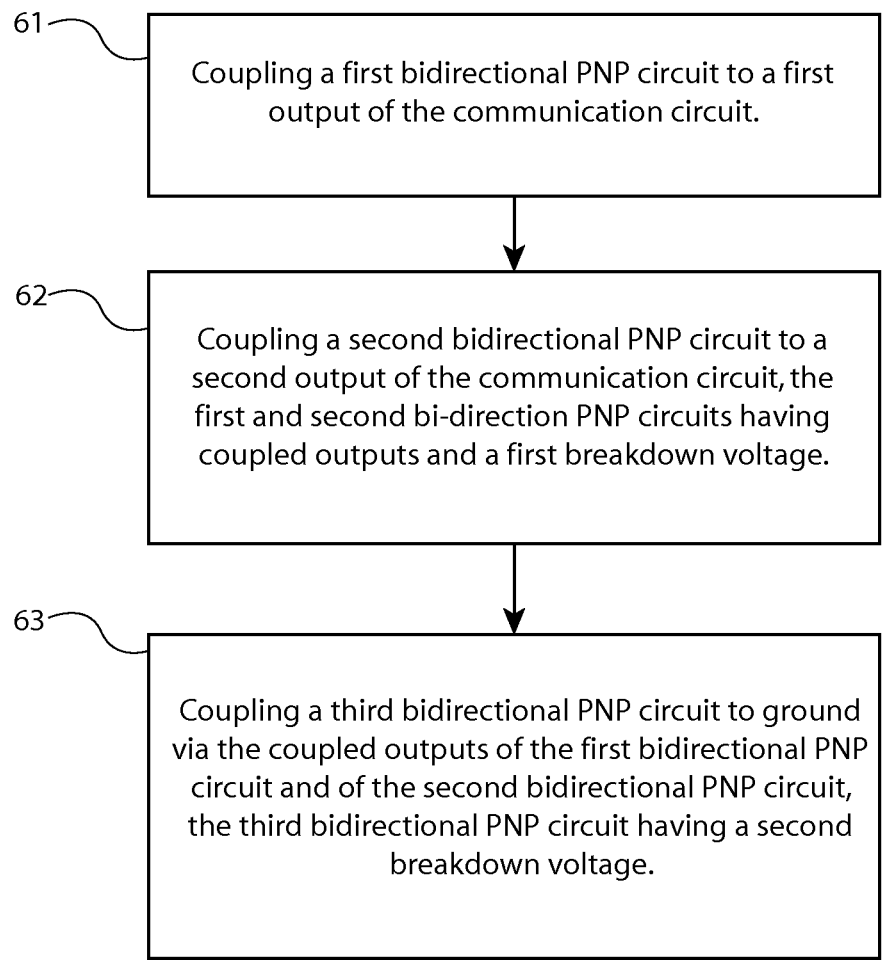
FIG. 6 is a flow chart illustrating a method in accordance with an embodiment.

FIG. 6 is a flow chart representing a method 60 of providing electrostatic discharge protection to a communication circuit in accordance with some embodiments.

The method 60 includes the step 61 of coupling a first bidirectional PNP circuit to a first output of the communication circuit.

At step 62 a second bidirectional PNP circuit is coupled to a second output of the communication circuit, the first and second bi-direction PNP circuits having coupled outputs and a first breakdown voltage.

At step 63 a third bidirectional PNP circuit is coupled to ground via the coupled outputs of the first bidirectional PNP circuit and of the second bidirectional PNP circuit. The third bidirectional PNP circuit has a second breakdown voltage, which can be different from the first breakdown voltage. The first and the second bidirectional PNP circuits have at least a high voltage n-type well (HVNW) region serving as a PN junction diode that is coupled to a relatively higher voltage potential among a voltage supply input or a input/output contact pad.

In some embodiments, the first directional PNP circuit and the second bidirectional PNP circuits form a first cell and the third bidirectional PNP circuit forms a second cell and each cell has its own isolation ring preventing leakage current.

In one embodiment, a clamp circuit includes an electrostatic discharge (ESD) network having a first bidirectional transistor circuit coupled to a first output of an communication circuit, and a second bidirectional transistor circuit coupled to a second output of the communication circuit. The first and second bi-direction transistor circuits have coupled outputs and a first breakdown voltage. A third bidirectional transistor circuit is coupled to ground and arranged to receive the coupled outputs of the first bidirectional transistor circuit and of the second bidirectional transistor circuit. The third bidirectional transistor circuit has a second breakdown voltage. In some embodiments, a sum of the first breakdown voltage and the second breakdown voltage exceeds 60 volts and the communication circuit is an automotive application circuit such as a serial automotive communication application. In some embodiments, the first and second bidirectional transistor circuits form a part of a cell of an integrated circuit having an isolation structure to sustain high voltage. In some embodiments the first and the second bidirectional circuit have at least one of a high voltage P-type well (HVPW) or high voltage n-type well (HVNW) serving as a pn junction diode. The ESD network can be part of a stacked cell where each cell has its own isolation ring. The stacked cell structure can also reduce an integrated circuit area. In one embodiment, the first bidirectional transistor circuit is a first bidirectional PNP circuit, the second bidirectional transistor circuit is a second bidirectional PNP circuit, and the third bidirectional transistor circuit is a third bidirectional PNP circuit.

In one embodiment, a device includes a first bidirectional PNP circuit coupled to a first output of an communication circuit, and a second bidirectional PNP circuit coupled to a second output of the communication circuit. The first and second bi-direction PNP circuits have coupled outputs and a first breakdown voltage. A third bidirectional PNP circuit is coupled to ground via the coupled outputs of the first bidirectional PNP circuit and of the second bidirectional PNP circuit. The third bidirectional PNP circuit has a second breakdown voltage. In some embodiments, a sum of the first breakdown voltage and the second breakdown voltage exceeds 60 volts and the communication circuit is an automotive application circuit such as a serial automotive communication application. In some embodiments, the first and second bidirectional transistor circuits form a part of a cell of an integrated circuit having an isolation structure to sustain high voltage. In one arrangement the first and the second bidirectional PNP circuits have at least one of a high voltage P-type well (HVPW) or high voltage n-type well (HVNW) serving as a PN junction diode. The ESD network can be part of a stacked cell in which each cell has its own isolation ring. The stacked cell structure can also reduce an integrated circuit area. In one embodiment, the first bidirectional PNP circuit and the second PNP bidirectional circuit are formed on a first substrate, and the third bidirectional PNP circuit is formed on a second substrate.

In another embodiment, a method of providing electrostatic discharge protection to a communication circuit includes coupling a first bidirectional PNP circuit to a first output of the communication circuit, coupling a second bidirectional PNP circuit to a second output of the communication circuit, the first and second bi-direction PNP circuits having coupled outputs and a first breakdown voltage, and coupling a third bidirectional PNP circuit to ground via the coupled outputs of the first bidirectional PNP circuit and of the second bidirectional PNP circuit, the third bidirectional PNP circuit having a second breakdown voltage. The first and the second bidirectional PNP circuits have at least a high voltage n-type well (HVNW) region serving as a pn junction diode that is coupled to a relatively higher voltage potential among a voltage supply input or a input/output contact pad. In another aspect, the first directional PNP circuit and the second bidirectional PNP circuits form a first cell and the third bidirectional PNP circuit forms a second cell and each cell has its own isolation ring preventing leakage current.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Embodiments can include, but are not limited to any bi-directional clamp structure used for communication circuits or automotive circuits.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

What is claimed is:

1. A clamp circuit, comprising:
    an electrostatic discharge (ESD) network, comprising:
        a first bidirectional circuit coupled to a first output of a communication circuit;
        a second bidirectional circuit coupled to a second output of the communication circuit, the first and second bidirectional circuits having respective outputs that are coupled together and each having a first breakdown voltage, each of the first and second bidirectional circuits including a bidirectional PNP portion disposed laterally adjacent to an isolation portion, the isolation portion including first and second P-wells separated by a N-well, and each bidirectional PNP portion including a shallow N-well, and first and second P+ diffusion regions separated by an isolation region formed within the shallow N-well, and wherein the shallow N-well is formed within the first P-well of the isolation portion; and
        a third bidirectional circuit coupled to ground and to outputs of the first bidirectional circuit and of the second bidirectional circuit, the third bidirectional circuit having a second breakdown voltage.

2. The clamp circuit of claim 1, wherein a sum of the first breakdown voltage and the second breakdown voltage exceeds 60 volts.

3. The clamp circuit of claim 1, wherein the communication circuit is an automotive application circuit.

4. The clamp circuit of claim 1, wherein the communication circuit is a serial automotive communication application.

5. The clamp circuit of claim 1, wherein the first and second bidirectional circuits form a part of a cell of an integrated circuit having an isolation structure to sustain high voltage.

6. The clamp circuit of claim 1, wherein the ESD network is part of a stacked cell where each respective cell has a respective isolation ring.

7. The clamp circuit of claim 1, wherein the ESD network is a stacked cell structure.

8. The clamp circuit of claim 1, wherein the third bidirectional transistor circuit includes a third bidirectional PNP circuit.

9. A device comprising:
    a first bidirectional PNP circuit coupled to a first output of a communication circuit;
    a second bidirectional PNP circuit coupled to a second output of the communication circuit, the first and second bidirectional PNP circuits having respective outputs that are coupled together and each having a first breakdown voltage; and
    a third bidirectional PNP circuit coupled to ground and to outputs of the first bidirectional PNP circuit and of the second bidirectional PNP circuit, the third bidirectional PNP circuit having a second breakdown voltage,
    wherein the first and second bidirectional circuits each include a PNP portion disposed laterally adjacent to an isolation portion, each PNP portion including a pair of P+ regions between which a shallow trench isolation structure is disposed, the pair of P+ regions and the shallow trench isolation structure formed in an upper surface of a shallow N-well, and the isolation portion including first and second P-wells separated by a second N-well that is separated from the shallow N-well by the first P-well, and wherein the shallow N-well is formed within the first P-well of the isolation portion.

10. The device of claim 9, wherein a sum of the first breakdown voltage and the second breakdown voltage exceeds 60 volts.

11. The device of claim 9, wherein the communication circuit is an automotive application circuit.

12. The device of claim 9, wherein the first and second bidirectional PNP circuits form a part of a cell of an integrated circuit having an isolation structure to sustain high voltage.

13. The device of claim 9, wherein at least one of the first and second P-wells of the isolation portion comprises a high voltage P-type well (HVPW) and the second N-well of the isolation portion comprises a high voltage N-type well (HVNW) to provide a pn junction diode.

14. The device of claim 9, wherein the device is a clamp circuit having the ESD network forming a part of a stacked cell where each respective cell has a respective isolation ring.

15. The device of claim 9, wherein the ESD network is a stacked cell structure.

16. The device of claim 9, wherein the first bidirectional PNP circuit and the second PNP bidirectional circuit are formed on a first substrate, and the third bidirectional PNP circuit is formed on a second substrate.

17. A method of providing electrostatic discharge protection to a communication circuit, comprising:
    coupling a first bidirectional circuit to a first output of the communication circuit;
    coupling a second bidirectional circuit to a second output of the communication circuit, the first and second bidirectional circuits having respective outputs that are coupled together and each having a first breakdown voltage, each of the first and second bidirectional circuits including a bidirectional PNP portion disposed laterally adjacent to an isolation portion, the isolation portion including first and second P-wells separated by a N-well, and each bidirectional PNP portion including a shallow N-well, and first and second P+ diffusion regions separated by an isolation region formed within the shallow N-well, and wherein the shallow N-well is formed within the first P-well of the isolation portion; and
    coupling a third bidirectional circuit to ground and to the outputs of the first bidirectional circuit and of the second bidirectional circuit, the third bidirectional circuit having a second breakdown voltage.

18. The method of claim 17, wherein the first bidirectional circuit and the second bidirectional circuit form a first cell and the third bidirectional circuit forms a second cell, and wherein each cell has its own isolation ring for preventing leakage current.

* * * * *